United States Patent [19]

Brown et al.

[11] Patent Number: 5,213,513
[45] Date of Patent: May 25, 1993

[54] ELECTRIC TERMINAL

[75] Inventors: Richard L. Brown, Manitowish Waters, Wis.; James D. Scapardine, Aurora, Ill.

[73] Assignee: Seatt Corporation, Downers Grove, Ill.

[21] Appl. No.: 859,052

[22] Filed: Feb. 27, 1992

[51] Int. Cl.⁵ .......................................... H01R 9/09
[52] U.S. Cl. ..................................... 439/68; 310/355; 439/751; 439/862
[58] Field of Search ...................... 439/78, 74, 55, 66, 439/71, 68, 751, 862; 310/346, 348-356

[56] References Cited

U.S. PATENT DOCUMENTS

| | | | |
|---|---|---|---|
| 2,947,964 | 8/1960 | Johanson et al. | 439/62 |
| 3,299,301 | 1/1967 | Heilmann et al. | 310/355 |
| 3,679,919 | 7/1972 | Ichinose et al. | 310/355 |
| 3,865,458 | 2/1975 | Pauza et al. | 439/71 |
| 3,885,173 | 5/1975 | Lee | 439/71 |
| 4,230,383 | 10/1980 | Burnstein et al. | 439/862 |
| 4,273,399 | 6/1981 | Myers et al. | 310/353 |
| 4,295,009 | 10/1981 | Weidler | 310/348 |

Primary Examiner—Neil Abrams
Attorney, Agent, or Firm—Augustus G. Douvas

[57] ABSTRACT

An electric terminal particularly designed to establish circuit connection with a piezoelectric ceramic disc employed in a smoke detector alarm horn. The electric terminal comprises a pair of joined and spaced sidewalls disposed in a generally parallel relationship with respect to each other, a contact-beam support wall joining the pair of sidewalls, and a resilient, cantilevered contact beam having a first curved section fixed to the support wall and having a generally straight section formed with a pointed electrical contact adapted to engage the piezoelectric ceramic disc or other electrical load.

8 Claims, 3 Drawing Sheets

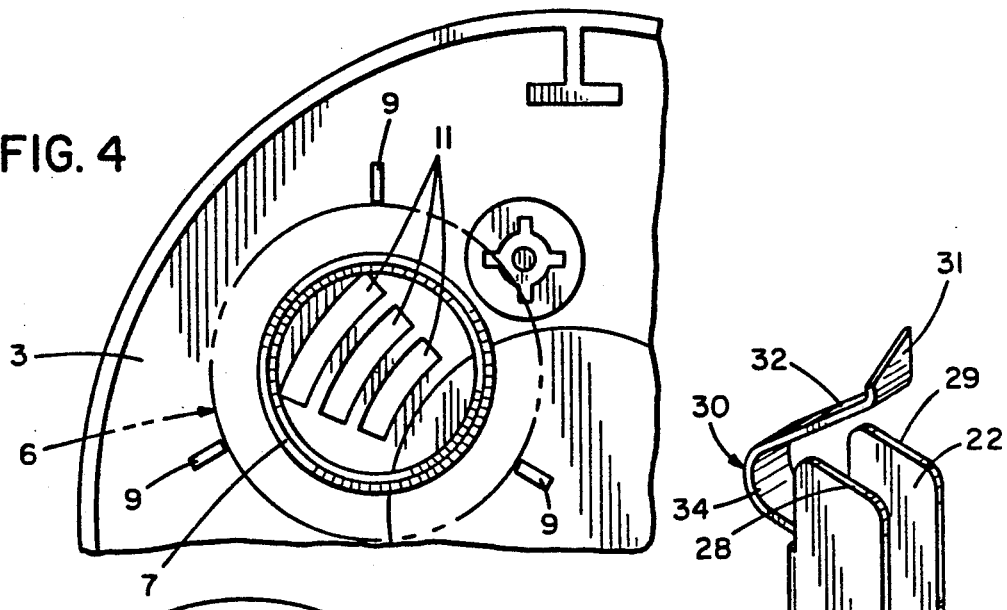
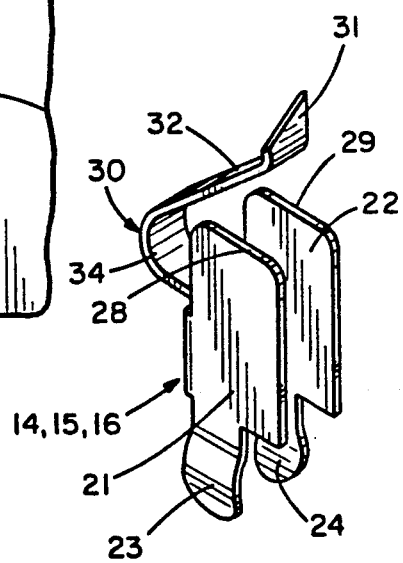
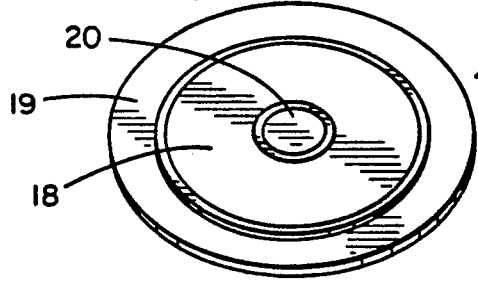
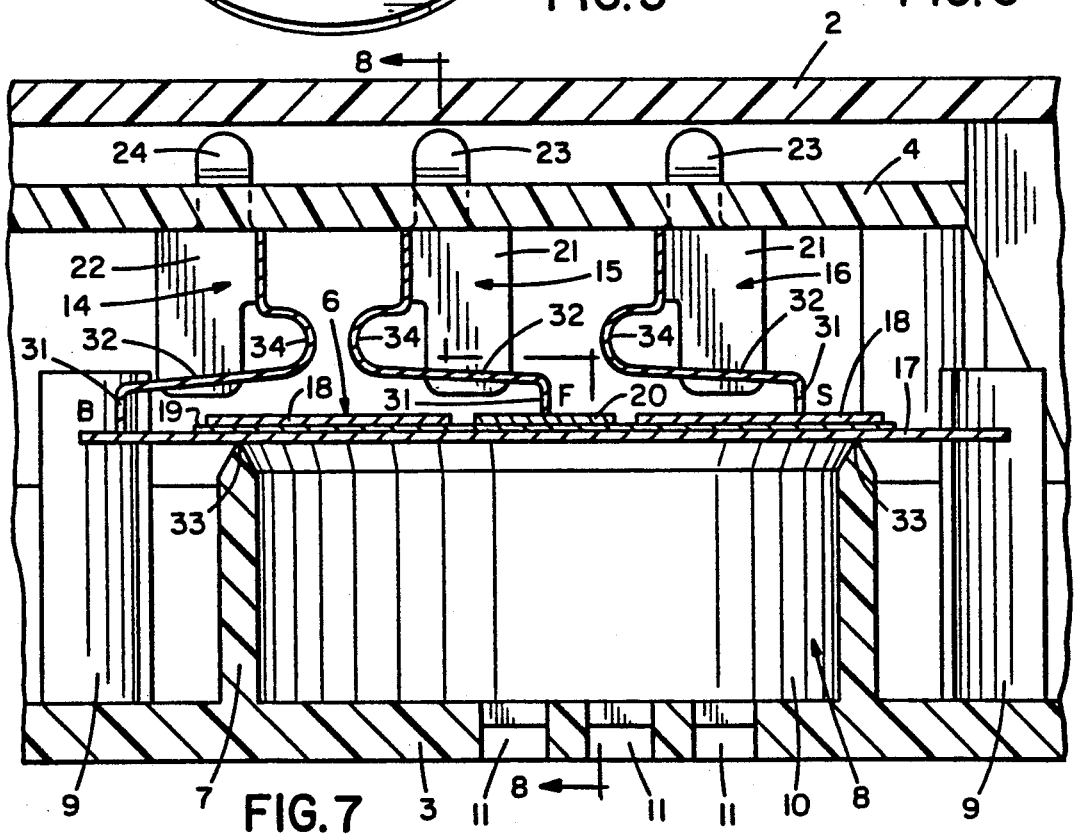

ELECTRIC TERMINAL

This invention relates to an electric terminal which is particularly designed for establishing electric circuit connection with a piezoelectric ceramic disc employed in a smoke detector alarm horn.

BACKGROUND OF THE INVENTION

Most modern residential smoke detectors employ piezoelectric alarm horns to effect audible supervision signals and products-of-combustion alarm warnings. A piezoelectric horn generally comprises an acoustic chamber formed by an annular wall integral with a smoke detector cover. A piezoelectric disc is seated upon the wall to close the chamber internally; and the smoke detector cover is formed with sound openings from which audible signals emanate.

Electrical connections must be established with the piezoelectric disc to complete an oscillator circuit which drives the disc into a sound-generating vibratory state. In general, these electrical connections to the piezoelectric disc are not hardwired, but are manually separable. For example, the connections may be effected by terminals supported on a circuit board fixed to a smoke detector base, and the piezoelectric disc is fixed to an acoustic chamber integral with the smoke detector cover. When the smoke is assembled, the necessary circuit connections to the piezoelectric disc are established.

A two-piece assembly employing a metal bead pin supporting a coil spring is commonplace in prior-art terminals applied to piezoelectric discs used in smoke detector horns. The bead pin is inserted into a circuit board with a bench press. The circuit board has a narrow tolerance hole diameter to insure that the bead pin fits tightly when forced into the board. In actual practice, several bead pins are first loaded into a fixture that inserts them into a board. This is a laborious process. At the outset, this was done manually by an operator. At a later time, a method was devised by which several pins were vibrated over the surface of the circuit board, and eventually most or all of the pins would fall by themselves into the proper holes.

Once all of the pins were inserted into a production circuit board, the board would be stuffed with the remaining necessary electronic components and thereafter wave soldered. After passing an electrical functional test, the circuit board would be transferred to final assembly where an extremely small coil spring contact would be placed manually on each bead pin. An assembled coil spring on a bead pin would constitute a spring contact for a piezoelectric disc.

Missing coil springs and springs misaligned due to improper insertion on the bead pin were commonplace production problems.

When the smoke detector is assembled, the springs are in contact with a side of the piezoelectric disc. Since the plastic cases of smoke detectors are relatively flexible, being made of molded elements that are less than 0.08 inches thick, user manipulation, by squeezing or pressing the smoke detector housing, would cause the springs to rub on the piezoelectric disc. This action would cause a characteristic scratchy sound which was puzzling to the user and which led to the impression that the smoke detector was of cheap quality.

SUMMARY OF THE INVENTION

Accordingly, a principal object of this invention is to provide a reliable and inexpensive electric terminal for application to a piezoelectric disc which is simple in construction and which is easily manually applied to a circuit board.

Another object is to provide an electric terminal which does not require a stringent spacing tolerance between a circuit board and a piezoelectric disc.

Another object is to provide an improved electric terminal which may be applied to establish electrical contact with various type of components spaced from a circuit board.

A preferred embodiment of the electric terminal of this invention features a one-piece terminal fabricated from spring stainless steel. This construction comprises a pair of joined and spaced sidewalls disposed in a generally parallel relationship with respect to each other. A contact-beam support wall joins the pair of sidewalls to form a generally U-shaped body. A resilient, cantilevered contact beam of folded construction is fixed to and projects from the support wall. The projecting end of the contact beam is formed with a pointed contact which engages and establishes an electrical connection with a piezoelectric disc, for example. The contact beam with its pointed contact are located in a symmetrical disposition with respect to both sidewalls and is resiliently depressible when the contact is engaged.

Adjacent spaced edges of the pair of sidewalls serve as protective stops which limit the extent of depression of the contact beam and its pointed contact. This feature, together with the folded construction, prevents the over-stressing of the contact beam to the point of shape distortion.

Because of the resilient structure of the contact beam, the spacing between a circuit board and the electrical component load to be contacted is not as critical as the contact beam adjusts its position over a relatively wide distance to establish electrical contact.

A very important advantage of the electric terminal of this invention is that it does not require fixturing or tooling for insertion into a circuit board. The pair of sidewalls enable an assembly-line worker to grab the terminal between two fingers for easy insertion into a circuit board. The contact has a set of projecting circuit-board tabs which effects a lock with a circuit board, when pushed into mating, slotted circuit-board holes. An applied terminal is very resistant to falling out, and thus maintains a correct orientation while passing over a wavesoldering machine.

Another design feature of the terminal of this invention is a relatively long beam length of folded construction. This allows a very consistent force to be applied by the contact point despite varying separation distances between the terminal and its load.

Another advantage of the design of this invention is the sharp point contact. Previous designs with rounded contacts do not have a large force per area factor. The pointed contact causes all its force to be applied to a very small portion of the surface, which results in a very dramatic increase in force per area. This greatly increases the contact reliability by preventing oxides or other contaminants from forming between the contact and the piezoelectric disc. Additionally, the scratchy noise that could be generated by motion of the smoke-detector cover (as the springs scraped against the disc) is now eliminated, because the sharp contact point tends to be immovable relative to the disc surface, that is, the contact actually will move with the disc as it is deflected by severe pressure on the cover, once the disc is assembled into a smoke detector. This gives the user a better quality product, in that it does not make a noise when manipulated, and also gives the user a more reliable product due to the better contact force.

DESCRIPTION OF THE DRAWINGS

In order that all of the structural features for attaining the objects of this invention may be readily understood, reference is made to the accompanying drawings in which:

FIG. 4 is a section view taken along line 4—4 of FIG. 2 which shows the relative positioning of the piezoelectric disc and a cylindrical wall to define an acoustic chamber;

FIG. 5 is a perspective view of a piezoelectric alarm disc;

FIG. 6 is a perspective view of an electric terminal of this invention;

FIG. 7 is an enlarged section view which shows a set of three electric terminals making circuit connections to three separate elements of a piezoelectric disc;

DETAILED DESCRIPTION OF THE INVENTION

Figure 1:
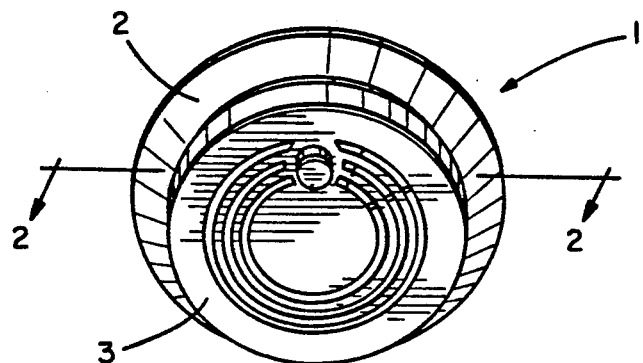
FIG. 1 is a perspective view of a smoke detector.
Figure 2:
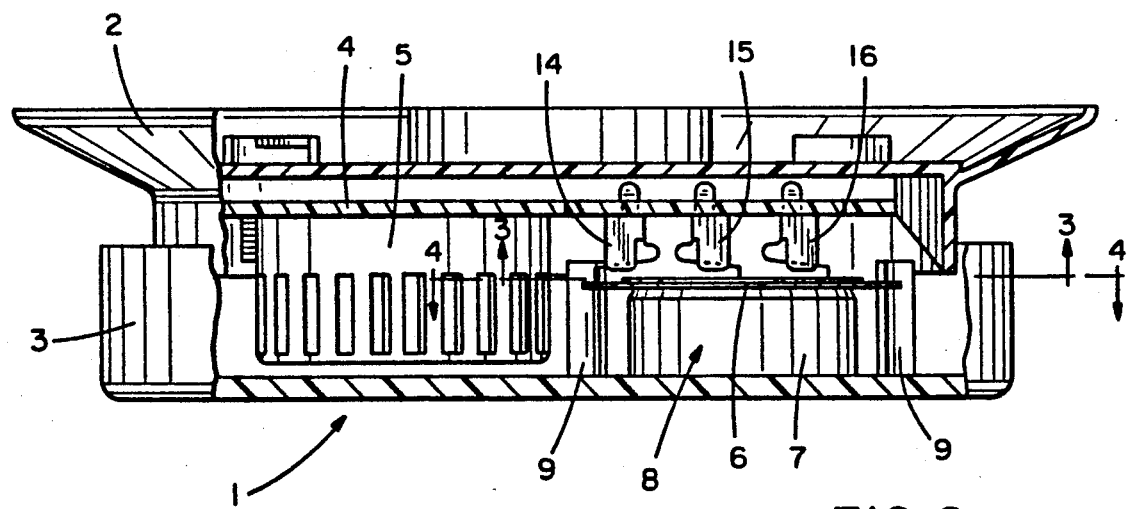
FIG. 2 is a section view taken along line 2—2 of FIG. 1 which shows a set of three electric terminals of this invention establishing electrical circuit connections between a circuit board and a piezoelectric disc incorporated within a piezoelectric alarm horn for the smoke detector.

Referring to the drawings, FIG. 1 shows a smoke detector 1 having a two-piece, manually-separable housing comprising plastic base 2 and plastic cover 3 (FIGS. 1 and 2). A circuit board 4 is fixed to base 2, and ionization chamber 5 is fixed to the circuit board. A piezoelectric sound disc 6 is seated upon a plastic circular wall 7 integrally molded to cover 3 to define an acoustic chamber for piezoelectric alarm horn 8. Sound disc 6 is retained in its seated position on circular wall 7 by a set of three plastic posts 9 also integrally molded to cover 3.

When appropriately electrically energized, sound disc 6 vibrates in a conventional manner to generate within the cavity 10 (FIGS. 7 and 8) an intense, high-pitched, audible sound which produces an intense responsive vibration of cover 3. Cover 3 is formed within a set of three elongated, curved openings 11 (FIGS. 1, 4, and 7) which provide an acoustic release for sound originating within cavity 10.

Figure 3:
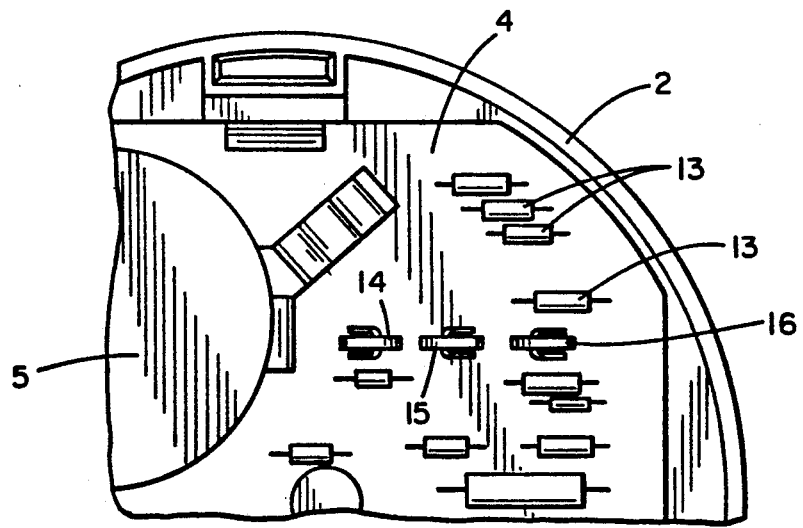
FIG. 3 is a section view taken along line 3—3 of FIG. 2 which shows a top view of the set of three electric terminals.

Sound disc 6 is electrically activated by making the disc part of an oscillator circuit 12 (FIG. 9) whose components 13 (FIG. 3) are located on circuit board 4. The set of three electric terminals 14, 15, and 16 (FIGS. 2, 3, 6, 7, and 8) establish the necessary interconnection.

Figure 9:
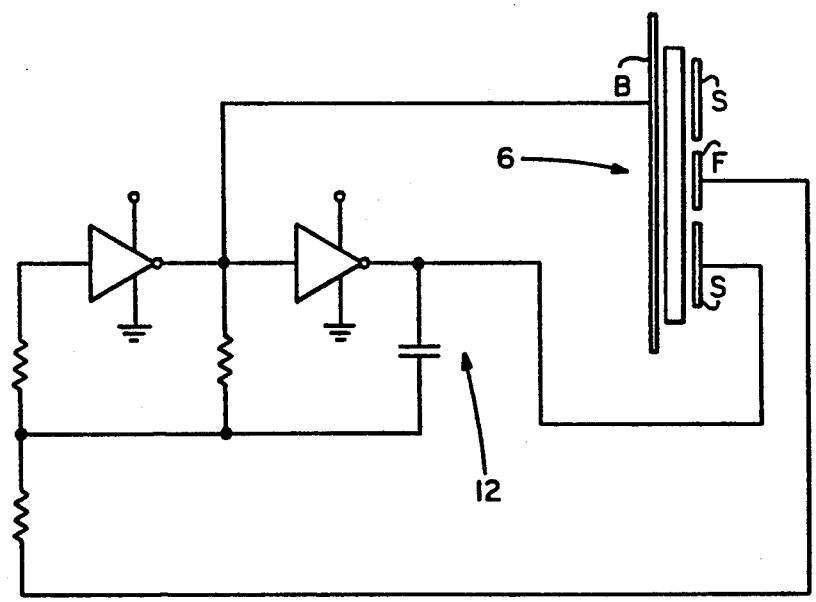
FIG. 9 is a schematic circuit of a conventional alarm oscillator for a piezoelectric alarm horn.

As is shown in the oscillator circuit of FIG. 9, sound disc 6 requires three external electric connections, which are conventionally known as the B, S, and F electrodes. The B electrode is the stainless steel disc 17 (FIG. 5 and 7) which serves as a base for piezoelectric disc 6. The S electrode is the annular screened nickel-silver electrode 18 which is fixed to the upper surface of circular, piezo-ceramic wafer 19. The F electrode is the circular, screened nickel-silver electrode 20 which is also fixed to the upper surface of wafer 19. The connections to the electrodes B, F, and S are effected by electric terminals 14, 15, and 16, respectively.

Each of electric terminals 14, 15, and 16 has an identical one-piece construction which is shown in FIG. 6. These terminals are preferably fabricated of stainless spring steel. Each terminal comprises a pair of sidewalls 21 and 22 disposed in a spaced, parallel relationship. Circuit-board locking tabs 23 and 24 project from the bottom edges of sidewalls 21 and 22, respectively. These tabs are formed with slight curves (FIG. 8) so that a firm, reliable lock is formed by the insertion of the tabs into mating slots 25 and 26 located in circuit-board 4. The back edges of sidewalls 21 and 22 are joined by contact-beam support wall 27. The top edges 28 and 29 of sidewalls 21 and 22 have rounded safety corners to prevent a cutting injury during the manual insertion of an electric terminal into circuit board 4. A resilient, cantilevered contact beam 30 projects from the top edge of support wall 27. Contract beam 30 includes a folded or curved section 34 joined to support wall 27. This curved section prevents metal fatigue due to the repeated flexing of contact beam 30. The projecting end of beam 30 is formed with an electric contact 31 which has a sharp point. This sharp point establishes a firm gas-tight connection to base 17, and sound disc electrodes 18 and 20 thus aiding in preventing increased contact resistance in corrosive environments.

Figure 8:
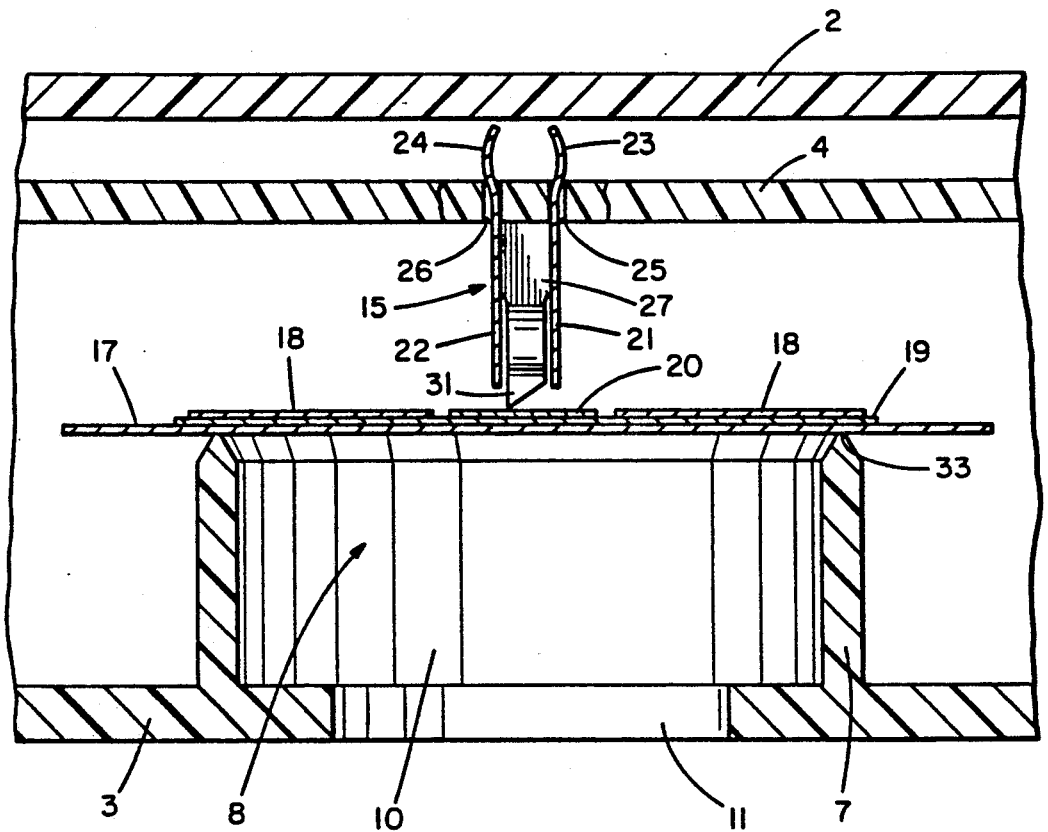
FIG. 8 is a section view taken along line 8—8 of FIG. 7 which shows the pointed contact of the electric terminal making circuit connection to the piezoelectric alarm disc.

As is shown in FIGS. 7 and 8, when electric terminals 14, 15, and 16 establish electrical contact with sound disc 6, resilient contact beam 30 is depressed. Depending on the particular spaced disposition of circuit board 4 and sound disc 6, the straight segment 32 of contact beam 30 may or may not be depressed to a sandwiched position between sidewalls 21 and still maintain operational contact with sound disc 6. In FIGS. 7 and 8, contact beam 30 is depressed to a sandwiched position, but electric contact 31 remains disposed outside the extended elevation lines (imaginary) of sidewall edges 28 and 29. Edges 28 and 29 serve as protective stops which limit the extent to which electric contact 31 may be depressed. In particular, electric contact 31 may not be depressed beyond these imaginary elevation lines because disc 6 is stopped by edges 28 and 29. Accordingly, contact-beam 30 is protected from over stress beyond the elastic limit of the spring steel used in the fabrication of electric terminals 14, 15, and 16.

If smoke detector 1 is disassembled by separating base 2 from cover 3, contacts 31 of electric terminals 14, 15, and 16 are automatically disconnected from sound disc 6; and in turn, if smoke detector 1 is assembled contacts 31 are automatically connected to sound disc 6.

It is noted, that sound disc 6 is seated upon an annular, pointed rim 33 formed on circular wall 7. Rim 33 supports disc 6 at the nodal focus of the disc as defined by the resonant frequency of the disc. This support disposition is conventionally termed nodal mounting. An alternative mounting technique known as edge mounting (not shown) by which disc 6 is supported peripherally on its circular edge, may also be employed satisfactorily with terminals 14, 15, and 16 of this invention.

In any event, whether disc 6 is supported by nodal mounting or edge mounting, the central portion of the disc vibrates in a manner characteristic of piezoelectric materials. Notwithstanding the vibrational movement of the disc, the resiliency of contact beam 30 establishes a continuous and reliable electrical contact between electric contact 31 and disc 6.

The previously described structures illustrates the principles and features of this invention. It is noted that design changes can be made without departing from the scope of the invention.

What is claimed is:

1. An electric terminal adapted to complete a circuit connection to an electrical load comprising a pair of joined and spaced sidewalls disposed in a generally parallel relationship with respect to each other, a contact-beam support wall joining the pair of sidewalls, and a resilient, cantilevered contact beam having a first end fixed to the support wall and an opposite projecting end formed as an electrical contact for engaging the electrical load with the contact beam and its contact being located in a symmetrical disposition relative to both sidewalls and resiliently depressible when the contact is engaged by the electrical load, and in which corresponding adjacent spaced edges of the pair of sidewalls serve as protective stops which limit the extent of depression of the electrical contact in response to a circuit connection being established by contact engagement with the load.

2. The electrical terminal of claim 1 in which the opposite projecting end of the contact beam supports the electrical contact in its undepressed condition beyond the spaced edges of the sidewalls and its fully depressed condition between the spaced edges of the contact beam.

3. The electrical terminal of claim 1 in which the electrical load is a relatively flat, disc-like piezoelectric sound element.

4. The electrical terminal of claim 1 in which a circuit-board locking tab projects from an edge of each sidewall opposite the edge which serves as a protective stop.

5. The electrical terminal of claim 1 in which the contact is formed with a point which engages the electrical load to establish a circuit connection.

6. An electric terminal adapted to complete a circuit connection to an electrical load which is a relatively flat, disc-like piezoelectric sound element comprising a pair of joined and spaced sidewalls disposed in a generally parallel relationship with respect to each other, a contact-beam support wall joining the pair of sidewalls, and a resilient, cantilevered contact beam having a first end fixed to the support wall and an opposite projecting end formed with an electrical contact having a point which engages the load to establish a circuit connection with the contact beam and its contact being located in a symmetrical disposition relative to both sidewalls and resiliently depressible when the contact is engaged by the electrical load, and in which corresponding adjacent spaced edges of the pair of sidewalls serve as protective stops which limit the extent of depression of the electrical contact in response to a circuit connection being established by contact engagement with the load.

7. The electrical terminal of claim 6 in which a circuit-board locking tab projects from an edge of each sidewall opposite the edge which serves as a protective stop.

8. In a products-of-combustion detector utilizing a piezoelectric horn having a relatively flat, disc-like piezoelectric sound element which is spaced from a relatively flat circuit board supporting circuit components forming part of the horn circuitry and with the sound element and the circuit board being fixed relative to one another in a spaced, parallel disposition, the improvement comprising an electric terminal having a contact-support structure fixedly mounted on the circuit board in close proximity to the sound element and having a resilient, cantilevered contact beam carried on and projecting beyond an end of the contact-support structure with the beam formed with a contact firmly engaging the piezoelectric sound element in response to the depression of the contact beam by the piezoelectric element when the sound element and the circuit board are fixedly mounted as part of the products of combustion detector and in which the contact-support structure includes a pair of spaced sidewalls and a contact-beam support wall joining the pair of sidewalls with the resilient, cantilevered contact beam having a first curved section fixed to the support wall and an opposite projecting end formed as the electrical contact and in which corresponding adjacent spaced edges of the pair of sidewalls serve as protective stops which limit the extent of depression of the contact in response to a circuit connection being established by contact with the piezoelectric sound element, thereby preventing damage to the piezoelectric sound element.

* * * * *